(12) United States Patent
Kumar

(10) Patent No.: US 8,476,940 B2
(45) Date of Patent: Jul. 2, 2013

(54) STRESS REDUCED CASCODED CMOS OUTPUT DRIVER CIRCUIT

(75) Inventor: Vinod Kumar, Pratapgarh (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/310,468

(22) Filed: Dec. 2, 2011

(65) Prior Publication Data
US 2013/0141140 A1    Jun. 6, 2013

(51) Int. Cl.
*H03B 1/00* (2006.01)
(52) U.S. Cl.
USPC ........... 327/108; 327/111; 327/112; 327/404; 327/434
(58) Field of Classification Search
USPC .................. 327/108, 111, 112, 310, 318, 379, 327/392, 399, 403, 404, 408, 409, 427, 434, 327/436, 437
See application file for complete search history.

(56) References Cited

U.S. PATENT DOCUMENTS

| | | | |
|---|---|---|---|
| 7,279,924 B1 * | 10/2007 | Shumarayev | 326/21 |
| 7,285,987 B2 * | 10/2007 | Chung | 327/65 |
| 8,026,745 B2 * | 9/2011 | Scott et al. | 327/108 |
| 8,044,684 B1 | 10/2011 | Monga | |
| 8,217,685 B2 * | 7/2012 | Scott et al. | 327/108 |
| 2008/0204109 A1 * | 8/2008 | Pilling et al. | 327/333 |

* cited by examiner

*Primary Examiner* — Lincoln Donovan
*Assistant Examiner* — Jung H Kim
(74) *Attorney, Agent, or Firm* — Hogan Lovells US LLP

(57) ABSTRACT

An output driver circuit includes first, second, third, and fourth transistors having a common current path, wherein a gate of the first transistor receives a first switching signal, a gate of the second transistor receives a first reference voltage, a gate of the third transistor receives a second reference voltage, and a gate of the fourth transistor receives a second switching signal, and wherein a first capacitor is coupled between the gate of the first transistor and the gate of the third transistor, a second capacitor is coupled between the gate of the second transistor and the gate of the fourth transistor, and an output signal is provided at a node coupling the second and third transistors.

26 Claims, 7 Drawing Sheets

STRESS REDUCED CASCODED CMOS OUTPUT DRIVER CIRCUIT

FIELD OF THE INVENTION

The present invention relates to input and output driver circuits.

BACKGROUND OF THE INVENTION

As feature sizes of semiconductor technology continues to shrink, the need arises to design high voltage IO interfaces by using the low voltage devices. The use of low voltage devices at high voltage results in over-voltage stress across the device terminals. The over-voltage stress across the device terminals results in reliability issues (degradation) like Hot Carrier Injection (HCI), Bias Temperature Instability (BTI) and Time-Dependent Dielectric Breakdown (TDDB) degradation in the devices over time. To reduce the reliability degradation on such devices, design techniques are being used to reduce the over-voltage stress across the device terminals. The cascode technique is one of the most common techniques used to design the 2×VDD (VDDE) voltage level IO buffer by using VDD voltage level devices, in which the VDD level reference voltage (REFH and REFL) derived from VDDE supply is used as biasing voltage for the cascoded devices. In such architectures the Vds stress (measured as the voltage difference between the drain and source terminals of the transistor) across the cascoded devices become very high during the transition, which leads to a very high HCI degradation in these cascoded devices. Therefore, to ensure the proper operation of devices over the time, the Vds stress across the cascoded devices must be minimized.

There is a pulse based approach proposed in the prior art (U.S. Pat. No. 8,044,684) to reduce the Vds stress across the cascoded devices during the transition. However, in that approach ensuring the pulse width and synchronizing it with the output transition time becomes very complex, especially across the different PVT corners. Therefore the pulse based technique reduces the Vds stress up to some extent, but not completely.

FIG. 1 shows a block diagram of a reference based output buffer 100 for high voltage applications showing the output pre-driver circuit 102, the output driver circuit 104, and the reference voltage generator 106. Also shown are the PD0 and ND0 signals, the REFH and REFL voltages, and the IO signal.

FIG. 2 shows a conventional architecture of a cascoded output driver circuit 200, including cascoded transistors MP2, MP1, MN1, and MN2 coupled between the VDDE power supply and the GNDE ground connection. The two switching signals and reference voltages, as well as the output signal previously referred to with FIG. 1 are also shown.

FIG. 3 shows a gate pulse based architecture of a cascoded output driver circuit 300, including transistors MP2, MP1, MN1, and MN2 coupled between the VDDE power supply and the GNDE ground connection. In addition to the previously reference PD0 and ND0 switching signals, the REFL and REFH voltages are shown as pulsed, and provided by the gate pulse generator 302, which in turn receives a plurality of control signals.

Therefore, a need remains for a relatively simple buffer circuit that addresses the Vds stress issue described above.

SUMMARY OF THE INVENTION

According to the present invention, an output driver circuit includes first, second, third, and fourth transistors having a common current path, wherein a gate of the first transistor receives a first switching signal, a gate of the second transistor receives a first reference voltage, a gate of the third transistor receives a second reference voltage, and a gate of the fourth transistor receives a second switching signal, and wherein a first capacitor is coupled between the gate of the first transistor and the gate of the third transistor, a second capacitor is coupled between the gate of the second transistor and the gate of the fourth transistor, and an output signal is provided at a node coupling the second and third transistors. The first and second transistors comprise PMOS transistors, and the third and fourth transistors comprise NMOS transistors. A buffer is interposed between the first switching signal and the gate of the first transistor to introduce a delay, and a buffer is interposed between the second switching signal and the gate of the fourth transistor to introduce a delay. A current path of an additional NMOS transistor is interposed between the first reference voltage and the gate of the second transistor, a gate of the additional transistor receives the first switching signal, and a resistor is in parallel with the current path of the additional transistor. A current path of an additional PMOS transistor is interposed between the second reference voltage and the gate of the third transistor, a gate of the additional transistor receives the second switching signal, and a resistor is in parallel with the current path of the additional transistor. A fifth transistor is in parallel with the first transistor, which can be a PMOS transistor and receives the first switching signal directly. The second transistor has a size of Y, the first transistor has a size of $(1-\beta)*Y$, and the fifth transistor has a size of $\beta*Y$, wherein $\beta$ has a value of less than 0.5. A sixth transistor is in parallel with the fourth transistor, which can be an NMOS transistor and receives the second switching signal directly. The third transistor has a size of X, the fourth transistor has a size of $(1-\beta)*X$, and the sixth transistor has a size of $\beta*X$, wherein $\beta$ has a value of less than 0.5.

DETAILED DESCRIPTION

Figure 1:
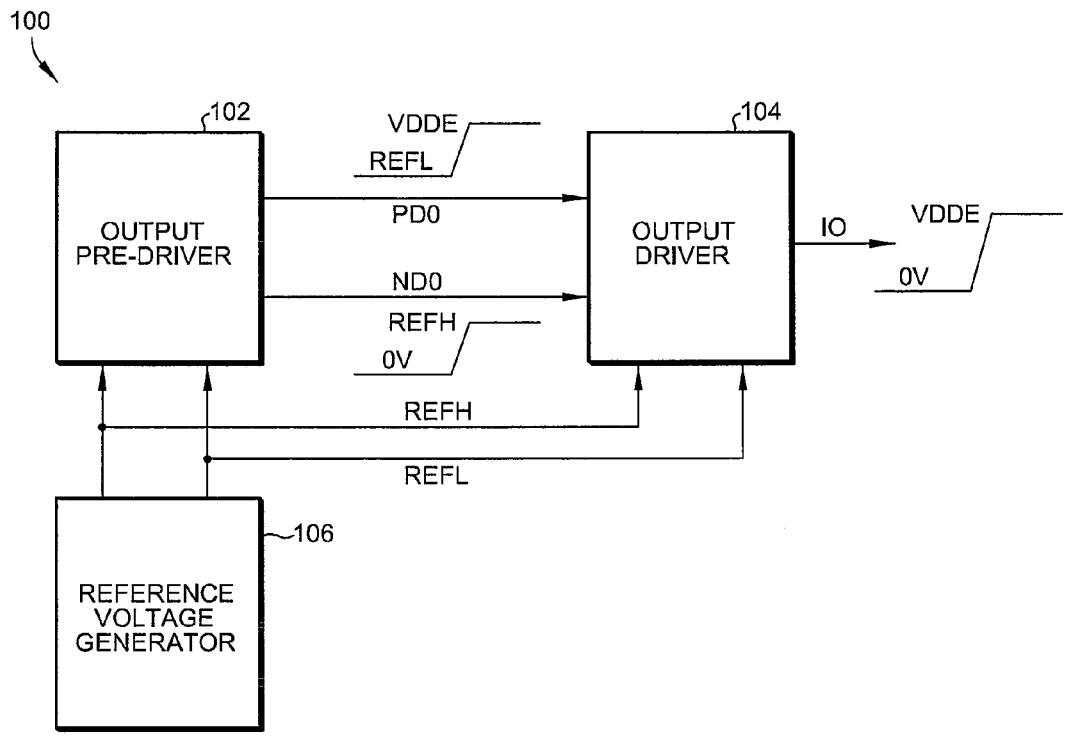
FIG. 1 is a block diagram of a reference based output buffer for high voltage application according to the prior art.
Figure 2:
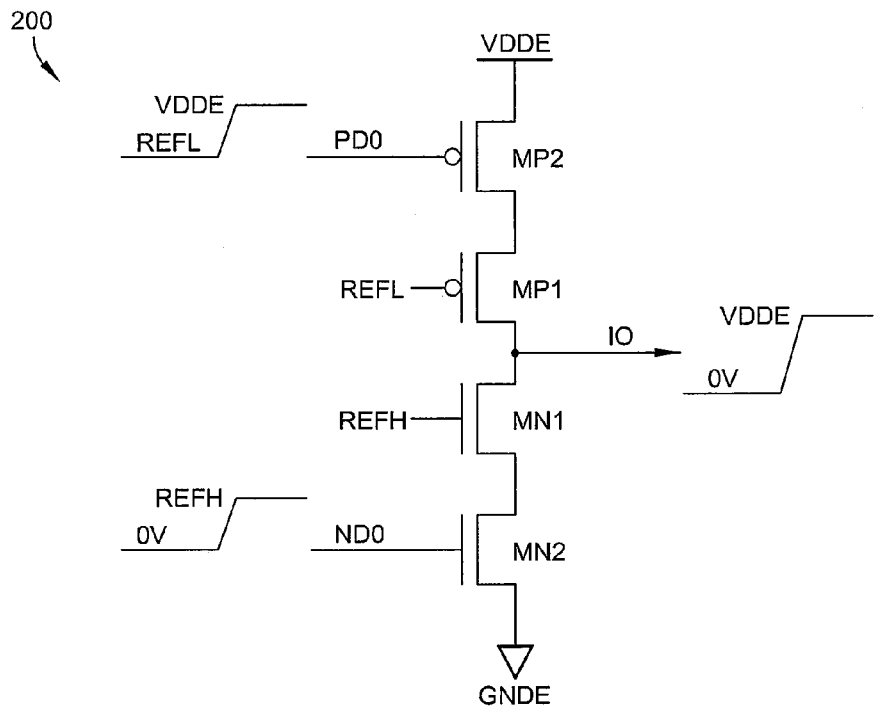
FIG. 2 is a conventional architecture of a cascoded output driver according to the prior art.
Figure 3:
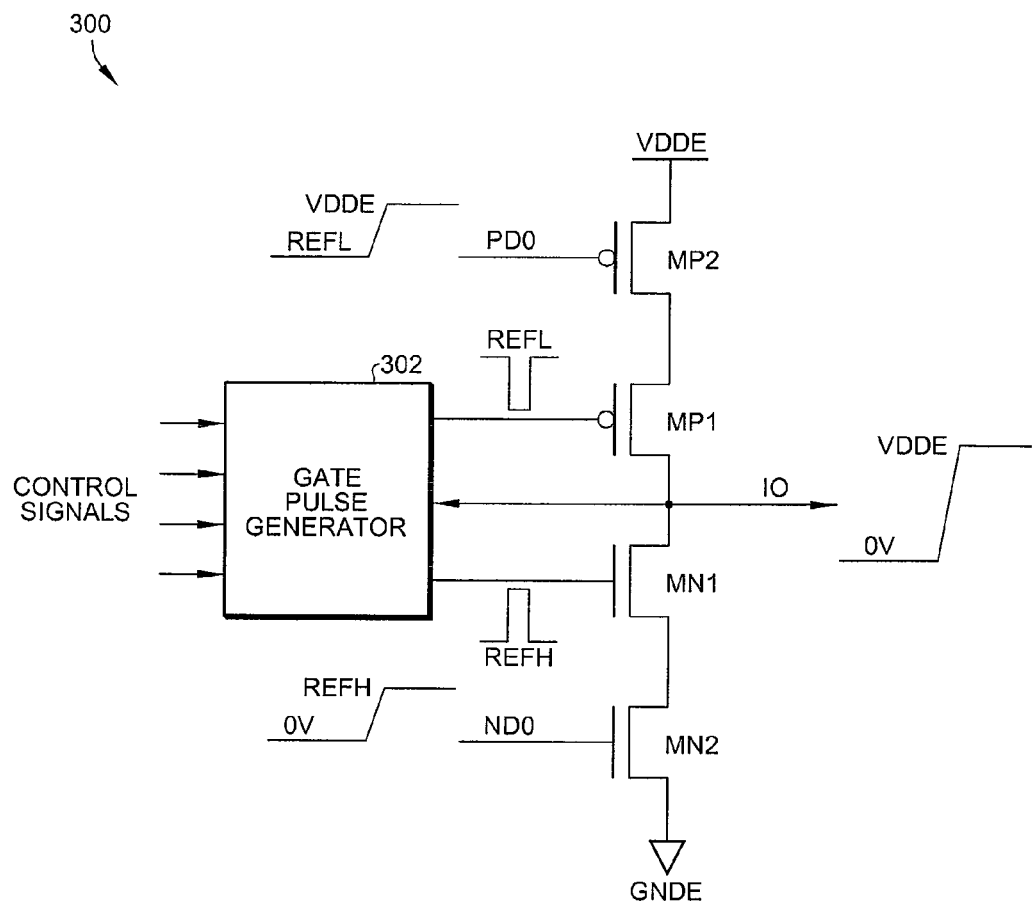
FIG. 3 is a gate pulse based architecture of a cascoded output driver according to the prior art.
Figure 4:
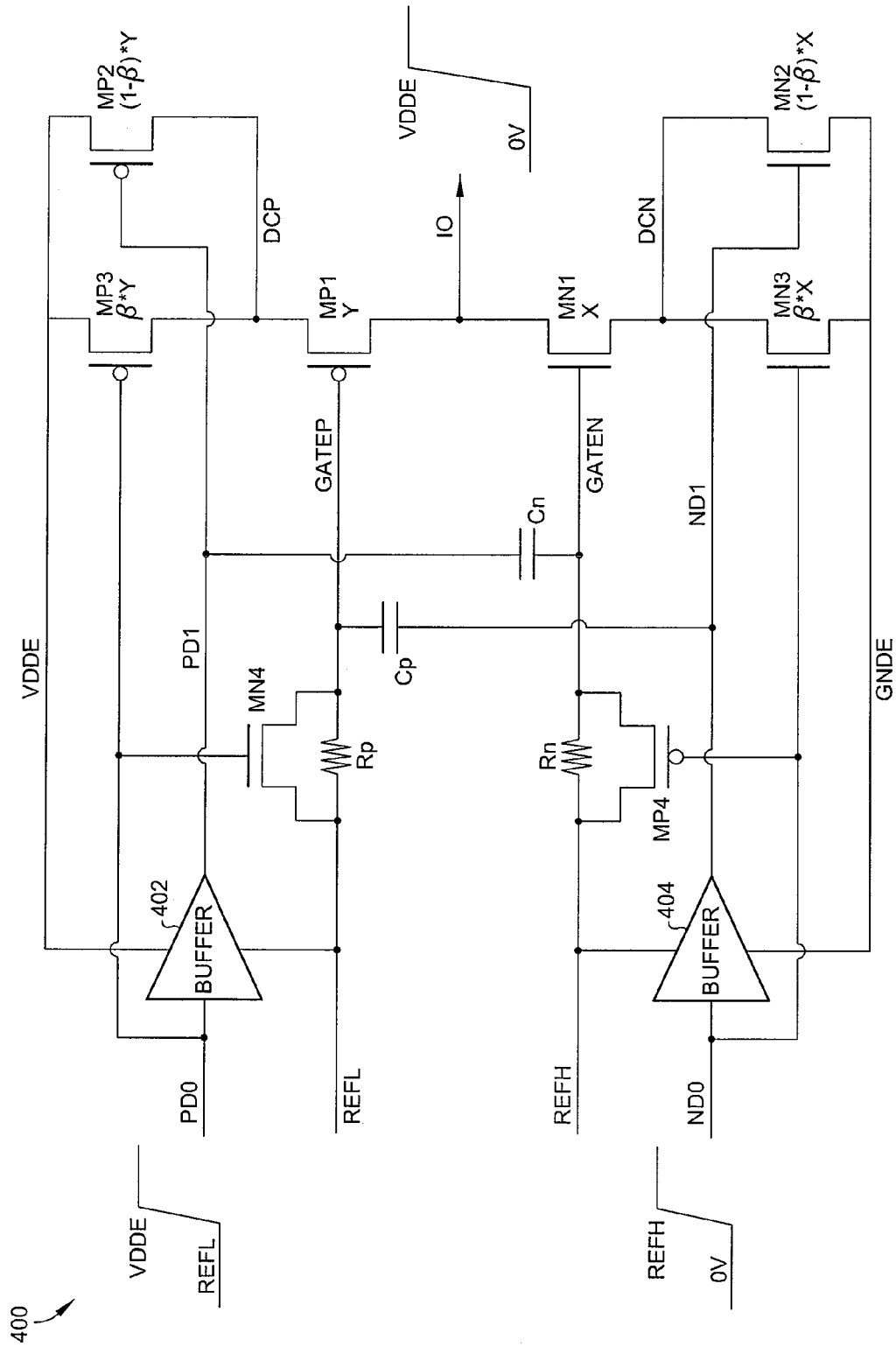
FIG. 4 is a proposed architecture of a cascoded output driver according to the present invention.

Referring now to FIG. 4, the circuit details of a new architecture of a cascoded output driver 400 are disclosed.

Output driver circuit 400 includes first (MP2), second (MP1), third (MN1), and fourth (MN2) transistors having a common current path, wherein a gate of the first transistor receives a first switching signal (PD0), a gate of the second transistor receives a first reference voltage (REFL), a gate of the third transistor receives a second reference voltage (REFH), and a gate of the fourth transistor receives a second switching signal (ND0), and wherein a first capacitor (Cn) is coupled between the gate of the first transistor and the gate of the third transistor, a second capacitor (Cp) is coupled between the gate of the second transistor and the gate of the fourth transistor, and an output signal (IO) is provided at a node coupling the second and third transistors. The first and second transistors comprise PMOS transistors, and the third and fourth transistors comprise NMOS transistors. A buffer 402 is interposed between the first switching signal and the gate of the first transistor to introduce a delay, and a buffer 404 is interposed between the second switching signal and the gate of the fourth transistor to introduce a delay. A current path of an additional NMOS transistor (MN4) is interposed between the first reference voltage and the gate of the second transistor, a gate of the additional transistor receives the first switching signal, and a resistor (Rp) is in parallel with the current path of the additional transistor. A current path of an additional PMOS transistor (MP4) is interposed between the second reference voltage and the gate of the third transistor, a gate of the additional transistor receives the second switching signal, and a resistor (Rn) is in parallel with the current path of the additional transistor. A fifth transistor (MP3) is in parallel with the first transistor, which can be a PMOS transistor and receives the first switching signal directly. The second transistor (MP1) has a size of Y, the first transistor (MP2) has a size of $(1-\beta)*Y$, and the fifth transistor (MP3) has a size of $\beta*Y$, wherein $\beta$ has a value of less than 0.5. A sixth transistor (MN3) is in parallel with the fourth transistor, which can be an NMOS transistor and receives the second switching signal directly. The third transistor (MN1) has a size of X, the fourth transistor (MN2) has a size of $(1-\beta)*X$, and the sixth transistor (MN3) has a size of $\beta*X$, wherein 13 has a value of less than 0.5.

The buffer 402 comprises a chain of CMOS inverters and works as a time delay element to introduce a delay between the first switching signal at node PD0 and node PD1.

The buffer 402 comprises a chain of CMOS inverters and works as a time delay element to introduce a delay between the second switching signal at node ND0 and node ND1.

A CMOS inverter comprises a PMOS transistor and an NMOS transistor. The source of the PMOS transistor is coupled to the supply voltage and the source of the NMOS transistor is coupled to ground. The gate of the PMOS and NMOS transistors are coupled together and to an input node, and the drains of the PMOS and NMOS transistors are coupled together and to an output node.

In the new architecture of the present invention, capacitive coupling is used to reduce the Vds stress across the cascoded devices of output driver 400. By adjusting the proper value of the coupling capacitor this technique can reduce the Vds stress on the cascoded devices of output driver substantially. In the technique of the present invention, the coupling on the gate of cascoded devices is self-synchronized with the switching of output driver and hence reduces circuit complexity. The proposed architecture of the present invention is self PVT (Process, Voltage, Temperature) compensated and hence ensures low Vds across the devices at all PVT corners. The technique of the present invention also cancels the switching noise of output driver 400 and prevents it from passing noise to the reference voltages. Since the switching noise of output driver 400 does not pass on to the reference voltage, the static current consumption and chip area requirement for the reference generators is reduced.

The GATEN node of cascoded NMOS driver transistor MN1 is coupled to the PD1 node of top PMOS driver transistor MP2 through a capacitor Cn. The reference voltage REFH is coupled to the GATEN node through an isolation resistor Rn to ensure that the high frequency switching noise component of node GATEN must not pass to the REFH voltage. Similarly, the GATEP node of cascoded PMOS driver transistor MP1 is coupled to the ND1 node of bottom NMOS driver transistor MN2 through a capacitor Cp. The reference voltage REFL is coupled to node GATEP through an isolation resistor Rp to ensure that the high frequency switching noise component of GATEP must not pass to the REFL voltage.

The use of transistors MN3 and MP3 reduces the Vds stress across the MN2 and MP2 transistors, respectively, during the switching of output driver 400. The value of $\beta<0.5$ is chosen in such a way that during the switching of output driver the voltage on nodes DCN and DCP must not cross the Vds stress limit of transistors MN2 and MP2, respectively.

Transistor MP4 is used to restrict the high voltage level (REFH+Vtp) on node GATEN during logic high to logic low switching of IO node. During logic low to logic high switching of IO node (which may go to a circuit pad in some embodiments), transistor MP4 couples the GATEN node with the REFH voltage. Similarly, transistor MN4 is used to restrict the low level voltage (REFL−Vtn) on the GATEP node during logic low to logic high switching of the IO node. During logic high to logic low switching of the IO node, transistor MN4 couples the GATEP node with the REFL voltage.

The operation of driver circuit 400 is described in further detail below.

During logic high to logic low transition of the IO node the parasitic capacitance of cascoded NMOS driver (MN1) will try to pull down the voltage on node GATEN. Now, since capacitor Cn is coupled between the GATEN and PD1 nodes, which is switched from logic low to logic high, the parasitic coupling effect of transistor MN1 is cancelled out by the coupling capacitor Cn. By using the proper size of capacitor Cn the voltage on the GATEN node is increased to the required voltage level so that the Vds stress on transistor MN1 will be at a minimum. Similarly, during logic low to logic high transition of the IO node, the parasitic capacitance of cascoded PMOS driver (MP1) will try to pull up the voltage on node GATEP. Now, since capacitor Cp is coupled between nodes GATEP and ND1, which is switched from logic high to logic low, the parasitic coupling effect of transistor MP1 is cancelled out by coupling capacitor Cp. By using the proper size of capacitor Cp, the voltage on node GATEP is reduced to the required voltage level so that the Vds stress on transistor MP1 will be at a minimum.

Since the capacitors Cn and Cp are cancelling out the parasitic coupling noise on the GATEN and GATEP nodes respectively due to output driver switching, the switching noise on the REFL and REFH voltages will be very small and hence the DC current consumption and chip area requirement for the reference generator circuit is reduced. Since the low to high switching of node PD1 is very fast, a small value of coupling capacitor Cn will give enough charge to increase the voltage on node GATEN. Similarly, the high to low switching of node ND1 is very fast and hence a small value of coupling capacitor Cp will give the required voltage level on node GATEP. Therefore, the technique of the present invention requires less circuit area in comparison to the driver circuits of the prior art.

The advantage of driver circuit 400 and a corresponding integrated circuit embodiment thereof over the prior art is thus reduced chip area, reduced power consumption, and increased operating life time.

Referring now to FIGS. 5-8, simulation results of the driver circuit 400 are shown.

Figure 5:
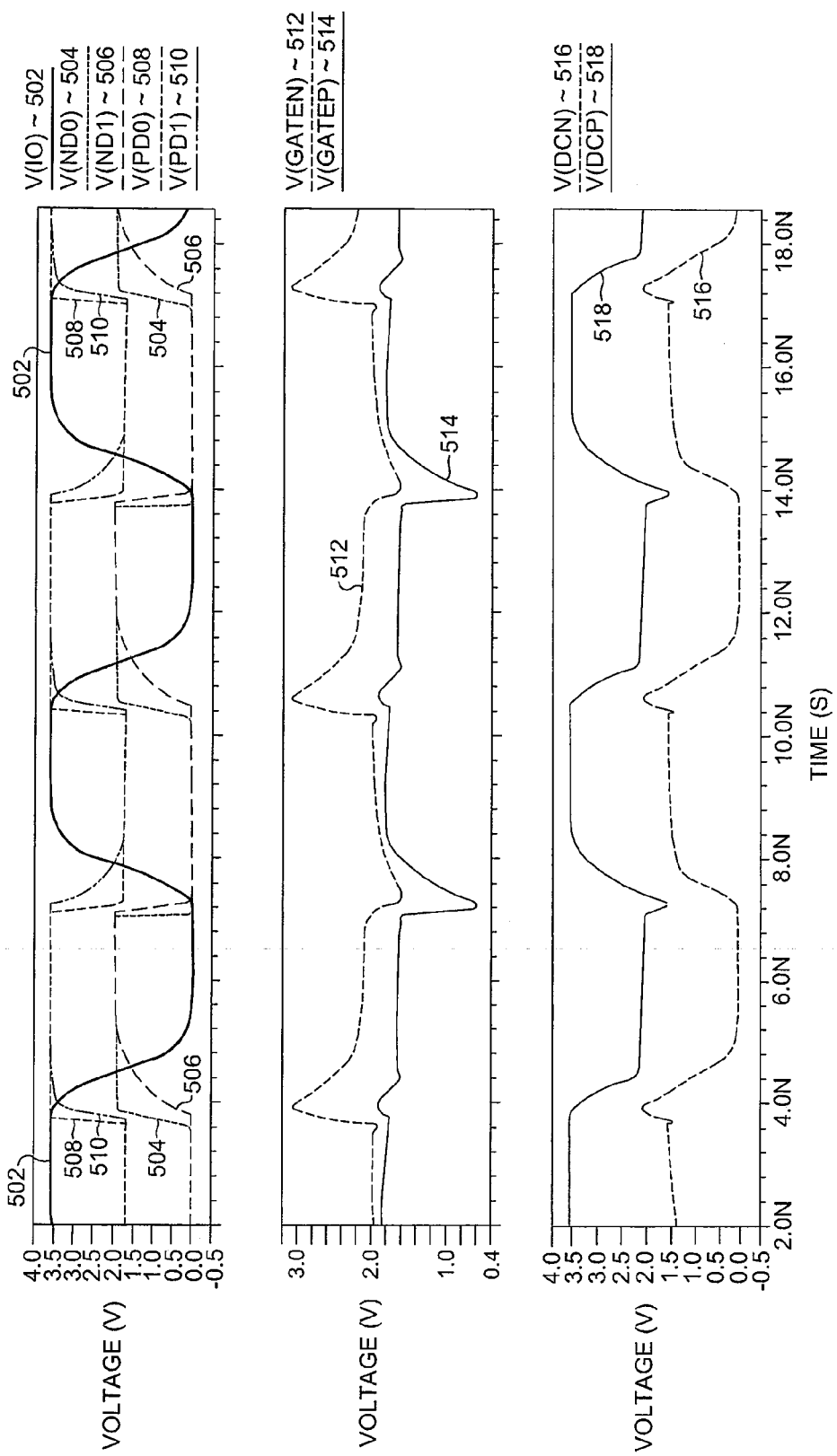
FIG. 5 is a simulated waveform of different nodes of the output driver according to the present invention.

Referring now to FIG. 5, simulated waveforms of different nodes of output driver 400 are shown. Voltage waveforms for the following nodes are shown in the top timing diagram: IO 502, ND0 504, ND1 506, PD0 508, and PD1 510. Voltage waveforms for the following nodes are shown in the middle timing diagram: GATEN 512 and GATEP 514. Voltage waveforms for the following cascaded node voltages are shown in the bottom timing diagram: DCN 516 and DCP 518.

Figure 6:
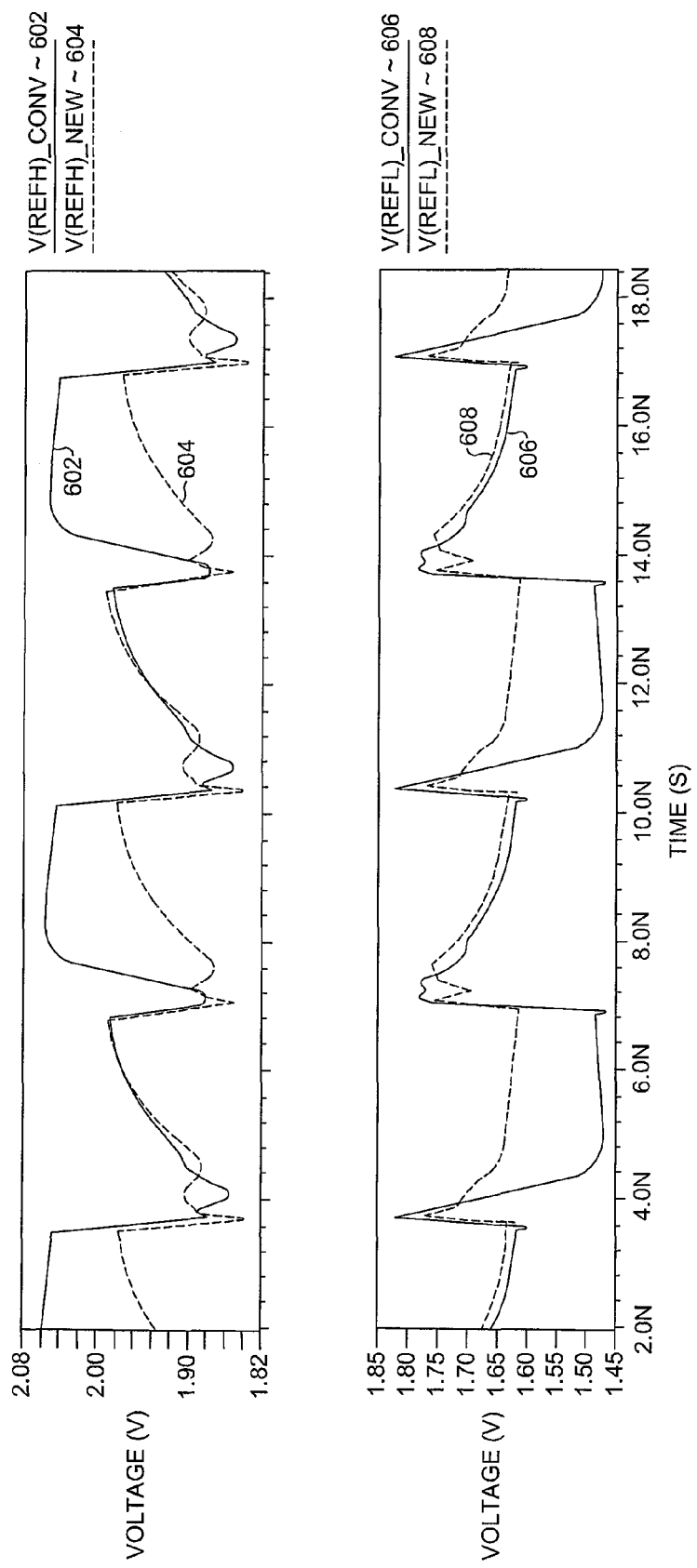
FIG. 6 is a simulated reference voltage noise comparison of the present invention with respect to a conventional architecture.

Referring now to FIG. 6, a simulated reference voltage noise comparison of the present driver circuit with respect to conventional architecture is shown. The conventional VREFH voltage 602 is compared to the new VREFH voltage 604. The conventional VREFL voltage 606 is compared to the new VREFL voltage 608. This comparison shows that the REFH and REFL voltages of the new architecture have less noise in comparison to that of the conventional architecture.

Figure 7:
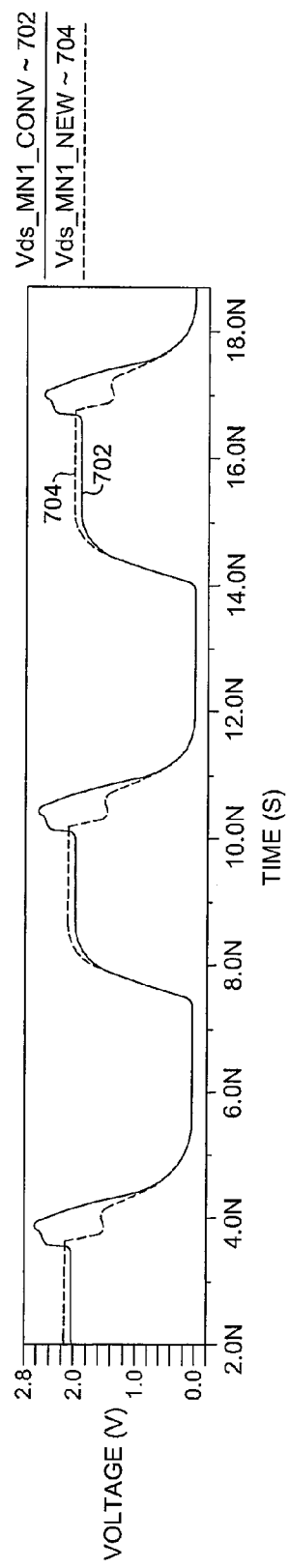
FIG. 7 is a simulated Vds stress comparison for the cascoded NMOS transistor (MN1) of the present invention with respect to a conventional architecture.

Referring now to FIG. 7, a simulated Vds stress comparison of the third NMOS transistor (MN1) of the present driver circuit with respect to the conventional architecture is shown. The conventional Vds voltage 702 is compared to the new Vds voltage 704 in the timing diagram. This comparison shows that in the new architecture the Vds stress of the cascoded transistor MN1 is substantially reduced in comparison to the that of the conventional architecture.

Figure 8:
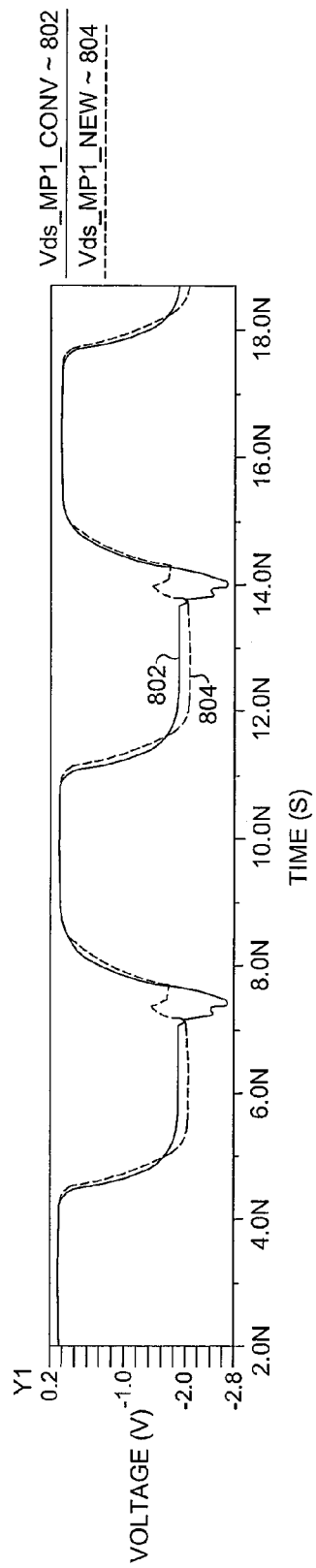
FIG. 8 is a simulated Vds stress comparison for the cascoded PMOS transistor (MP1) of the present invention with respect to a conventional architecture.

Referring now to FIG. 8, a simulated Vds stress comparison of the PMOS transistor (MP1) of the present driver circuit with respect to conventional architecture is shown. The conventional Vds voltage 802 is compared to the new Vds voltage 804 in the timing diagram. This comparison shows that in the new architecture the Vds stress of the cascoded transistor MP1 is substantially reduced in comparison to that of the conventional architecture.

Figure 9:
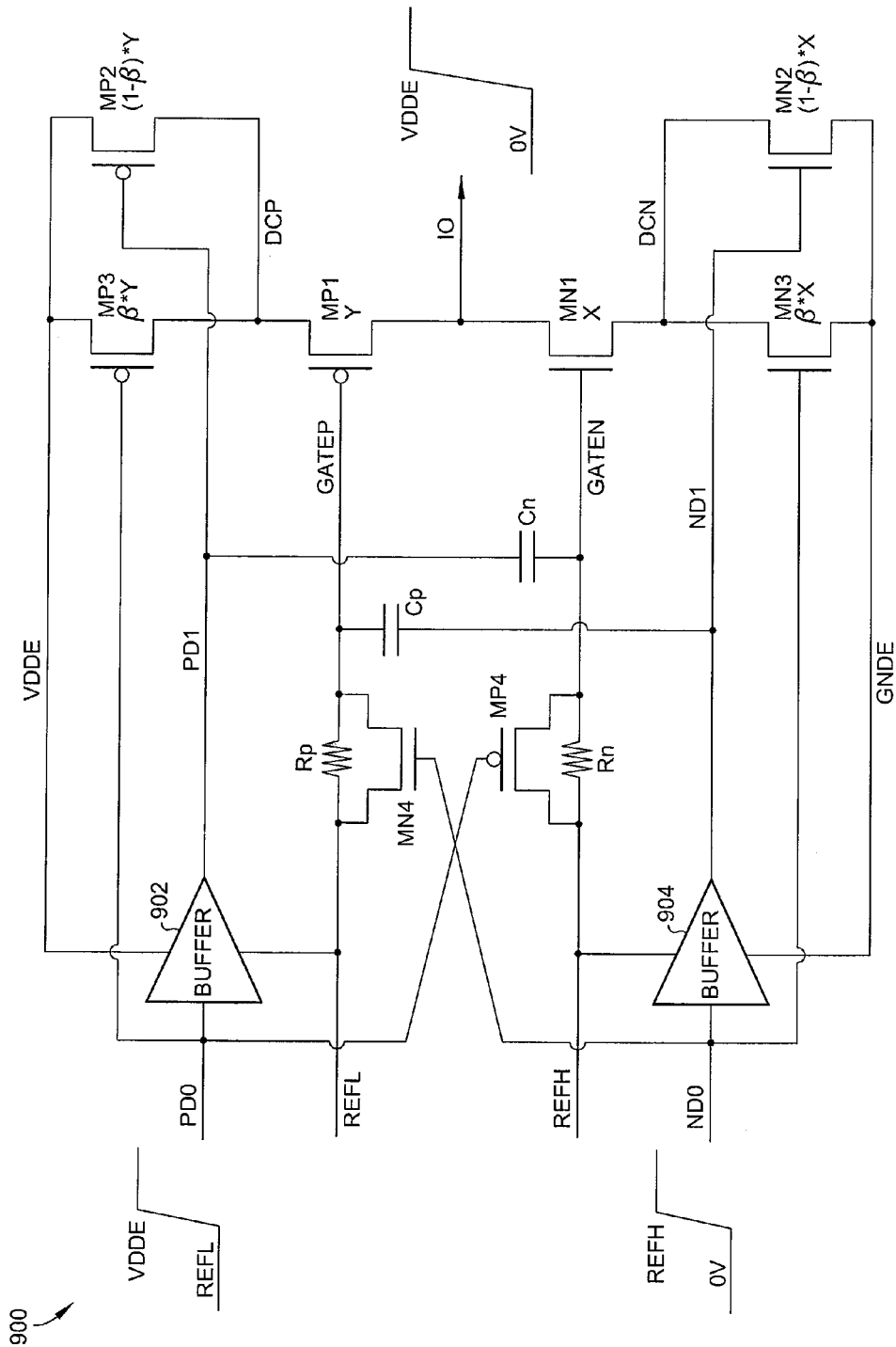
FIG. 9 is a proposed architecture of a cascoded output driver according to another embodiment of the present invention.

Referring not to FIG. 9, a further embodiment of the driver circuit of the present invention is shown. While the driver circuit 900 is substantially the same as the driver circuit 400 shown in FIG. 4 in terms of component count, note that the gate of transistor MN4 is now coupled to the ND0 node, and the gate of transistor MP4 is now coupled to the PD0 node.

It will thus be apparent to those skilled in the art that various modifications and variations can be made to the invention without departing from the spirit or scope of the invention. Thus, it is intended that the present invention covers the modifications and variations of this invention provided they come within the scope of the appended claims and their equivalents.

I claim:

1. An output driver circuit comprising:
first, second, third, and fourth transistors having a common current path, wherein
a gate of the first transistor receives a first switching signal,
a gate of the second transistor receives a first reference voltage,
a gate of the third transistor receives a second reference voltage, and
a gate of the fourth transistor receives a second switching signal, and wherein
a first capacitor is coupled between the gate of the first transistor and the gate of the third transistor,
a second capacitor is coupled between the gate of the second transistor and the gate of the fourth transistor, and
an output signal is provided at a node coupling the second and third transistors,
wherein a current path of an additional transistor is interposed between the first reference voltage and the gate of the second transistor, and a gate of the additional transistor receives the first or second switching signal.

2. The output driver circuit of claim 1 wherein the first and second transistors comprise PMOS transistors.

3. The output driver circuit of claim 1 wherein the third and fourth transistors comprise NMOS transistors.

4. The output driver circuit of claim 1 wherein a buffer is interposed between the first switching signal and the gate of the first transistor.

5. The output driver circuit of claim 1 wherein a buffer is interposed between the second switching signal and the gate of the fourth transistor.

6. The output driver circuit of claim 1 wherein the additional transistor comprises an NMOS transistor.

7. The output driver circuit of claim 1 further comprising a resistor in parallel with the current path of the additional transistor.

8. An output driver circuit comprising:
first, second, third, and fourth transistors having a common current path, wherein
a gate of the first transistor receives a first switching signal,
a gate of the second transistor receives a first reference voltage,
a gate of the third transistor receives a second reference voltage, and
a gate of the fourth transistor receives a second switching signal, and wherein
a first capacitor is coupled between the gate of the first transistor and the gate of the third transistor,
a second capacitor is coupled between the gate of the second transistor and the gate of the fourth transistor, and
an output signal is provided at a node coupling the second and third transistors,
wherein a current path of an additional transistor is interposed between the second reference voltage and the gate of the third transistor, and a gate of the additional transistor receives the first or second switching signal.

9. The output driver circuit of claim 8 wherein the first and second transistors comprise PMOS transistors.

10. The output driver circuit of claim 8 wherein the third and fourth transistors comprise NMOS transistors.

11. The output driver circuit of claim 8 wherein a buffer is interposed between the first switching signal and the gate of the first transistor.

12. The output driver circuit of claim 8 wherein a buffer is interposed between the second switching signal and the gate of the fourth transistor.

13. The output driver circuit of claim 8 wherein the additional transistor comprises a PMOS transistor.

14. The output driver circuit of claim 8 further comprising a resistor in parallel with the current path of the additional transistor.

15. An output driver circuit comprising:
first, second, third, and fourth transistors having a common current path, wherein
a gate of the first transistor receives a first switching signal,
a gate of the second transistor receives a first reference voltage,
a gate of the third transistor receives a second reference voltage, and
a gate of the fourth transistor receives a second switching signal, and wherein a first capacitor is coupled between the gate of the first transistor and the gate of the third transistor, a second capacitor is coupled between the gate of the second transistor and the gate of the fourth transistor, and an output signal is provided at a node coupling the second and third transistors; and a fifth transistor in parallel with the first transistor.

16. The output driver circuit of claim 15 wherein the first and second transistors comprise PMOS transistors.

17. The output driver circuit of claim 15 wherein the third and fourth transistors comprise NMOS transistors.

18. The output driver circuit of claim 15 wherein a buffer is interposed between the first switching signal and the gate of the first transistor.

19. The output driver circuit of claim 15 wherein a buffer is interposed between the second switching signal and the gate of the fourth transistor.

20. The output driver circuit of claim 15 wherein the fifth transistor comprises a PMOS transistor.

21. The output driver circuit of claim 15 wherein the second transistor has a size of Y, the first transistor has a size of $(1-\beta)*Y$, and the fifth transistor has a size of $\beta*Y$.

22. The output driver circuit of claim 21, wherein $\beta$ has a value of less than 0.5.

23. The output driver circuit of claim 15 further comprising a sixth transistor in parallel with the fourth transistor.

24. The output driver circuit of claim 23 wherein the sixth transistor comprises an NMOS transistor.

25. The output driver circuit of claim 23 wherein the third transistor has a size of X, the fourth transistor has a size of $(1-\beta)*X$, and the sixth transistor has a size of $\beta*X$.

26. The output driver circuit of claim 25, wherein $\beta$ has a value of less than 0.5.

* * * * *